United States Patent
Zhang et al.

(10) Patent No.: US 12,222,397 B2
(45) Date of Patent: Feb. 11, 2025

(54) ARC DETECTION METHOD FOR PERFORMING PROTECTION IN ENERGY STORAGE SYSTEM, AND RELATED APPARATUS

(71) Applicant: Huawei Digital Power Technologies Co., Ltd., Shenzhen (CN)

(72) Inventors: Yanzhong Zhang, Shanghai (CN); Yuandong Meng, Shanghai (CN); Baiyu Chen, Xi'an (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 501 days.

(21) Appl. No.: 17/447,991

(22) Filed: Sep. 17, 2021

(65) Prior Publication Data

US 2022/0003820 A1    Jan. 6, 2022

Related U.S. Application Data

(63) Continuation of application No. PCT/CN2020/075862, filed on Feb. 19, 2020.

(30) Foreign Application Priority Data

Mar. 26, 2019  (CN) .......................... 201910233232.4

(51) Int. Cl.
*G01R 31/382* (2019.01)
*H02H 7/18* (2006.01)

(52) U.S. Cl.
CPC ............. *G01R 31/382* (2019.01); *H02H 7/18* (2013.01)

(58) Field of Classification Search
CPC ................................ G01R 31/382; H02H 7/18
See application file for complete search history.

(56) References Cited

U.S. PATENT DOCUMENTS 8,924,169 B1 * 12/2014 Ledenev ................ H02S 50/10
                                                                      702/58
10,020,650 B2    7/2018 Roesner et al.
(Continued)

FOREIGN PATENT DOCUMENTS

CN          203456853 U     2/2014
CN          103869226 A     6/2014
(Continued)

*Primary Examiner* — Stephanie E Bloss
*Assistant Examiner* — Michael A Harrison
(74) *Attorney, Agent, or Firm* — WOMBLE BOND DICKINSON (US) LLP

(57) ABSTRACT

Embodiments of this application disclose an arc detection method for performing protection in an energy storage system, and a related apparatus, to improve accuracy of arc detection in an energy storage system, promptly take an arc extinguishing measure, and reduce a probability of causing a safety hazard. The method in the embodiments of this application includes: A control apparatus obtains an electrical signal at an electrical connection point in an energy storage system. The control apparatus determines a frequency domain amplitude based on a frequency domain characteristic of the electrical signal. When the frequency domain amplitude is greater than a preset amplitude, the control apparatus controls the energy storage system to perform an arc extinguishing and protection operation on the electrical connection point.

11 Claims, 4 Drawing Sheets

(56) References Cited

U.S. PATENT DOCUMENTS

| | | | |
|---|---|---|---|
| 2008/0143461 A1 | 6/2008 | Hastings et al. | |
| 2014/0373894 A1 | 12/2014 | Stratakos et al. | |
| 2015/0214834 A1 | 7/2015 | Trainer et al. | |
| 2016/0351042 A1 | 12/2016 | Chae et al. | |
| 2018/0109123 A1* | 4/2018 | Kaufmann | H01M 8/188 |
| 2019/0058338 A1 | 2/2019 | Narla | |

FOREIGN PATENT DOCUMENTS

| | | |
|---|---|---|
| CN | 104092440 A | 10/2014 |
| CN | 104237737 A | 12/2014 |
| CN | 105425082 A | 3/2016 |
| CN | 205193210 U | 4/2016 |
| CN | 107064733 A | 8/2017 |
| CN | 206400055 U | 8/2017 |
| CN | 107994866 A | 5/2018 |
| CN | 109239517 A | 1/2019 |
| CN | 109239558 A | 1/2019 |
| CN | 110048375 A | 7/2019 |

* cited by examiner

ARC DETECTION METHOD FOR PERFORMING PROTECTION IN ENERGY STORAGE SYSTEM, AND RELATED APPARATUS

CROSS-REFERENCE TO RELATED APPLICATIONS

This application is a continuation of International Application No. PCT/CN2020/075862, filed on Feb. 19, 2020, which claims priority to Chinese Patent Application No. 201910233232.4, filed on Mar. 26, 2019. The disclosures of the aforementioned applications are hereby incorporated by reference in their entireties.

TECHNICAL FIELD

Embodiments of this application relate to the field of energy storage, and in particular, to an arc detection method for performing protection in an energy storage system, and a related apparatus.

BACKGROUND

As a high-voltage direct current device, an energy storage system usually includes a direct current-direct current (DC-DC) converter, a battery management system (BMS), and a battery module. Usually, faults such as line insulation carbonization, a short circuit, or air ionization are prone to occur at a plurality of electrical connection points in the energy storage system, and consequently an arc is generated. A continuously burning arc results in high temperature of thousands of degrees. If the arc cannot be detected promptly, an electrical fire is prone to occur, causing economic and property losses. Therefore, in an initial stage of arc generation, if an arc fault can be recognized promptly and a protection measure can be taken, a fire can be effectively avoided.

In the conventional technology, the BMS may detect a current value and a voltage value of a battery module. Then, the BMS compares the current value with a preset maximum current threshold, and compares the voltage value with a preset minimum voltage threshold. When the current value is greater than the preset maximum current threshold, and the voltage value is less than the preset minimum voltage threshold, the battery management system determines that an arc fault occurs in the energy storage system.

In such a technical solution, the BMS can detect, only based on the current value and the voltage value of the battery module, whether a fault occurs in the energy storage system. When an arc fault just occurs, the current value and the voltage value of the battery module may not change significantly. Therefore, whether an arc fault occurs cannot be accurately determined only based on the current value and the voltage value of the battery. Consequently, a safety hazard may be caused because the arc fault cannot be accurately detected.

SUMMARY

Embodiments of this application provide an arc detection method for performing protection in an energy storage system, and a related apparatus, to improve accuracy of arc detection, promptly take an arc extinguishing measure, and reduce a probability of causing a safety hazard.

According to a first aspect, this application provides an arc detection method for performing protection in an energy storage system. The method includes: When a control apparatus needs to learn whether an arc fault occurs at each electrical connection point in an energy storage system, the control apparatus may first obtain an electrical signal at each electrical connection point in the energy storage system. Then, the control apparatus determines a frequency domain amplitude based on a frequency domain characteristic of the electrical signal. When the frequency domain amplitude is greater than a preset amplitude, the control apparatus may determine that an arc fault is likely to occur at the electrical connection point. In this case, the control apparatus controls the energy storage system to perform an arc extinguishing and protection operation on the electrical connection point.

In embodiments of this application, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

In one embodiment, the energy storage system includes a battery module, a battery management system (BMS), and a direct current-direct current (DC-DC) converter. The electrical connection point includes a connection point between the battery module and the BMS, a connection point between the BMS and the DC-DC converter, or a connection point between the DC-DC converter and a load circuit.

In this embodiment, the main components of the energy storage system are specified, and a specific position of an electrical connection point that may be arranged is specified. Therefore, in actual application, detection may be performed at the electrical connection point based on a detection requirement, so that an arc fault can be detected relatively comprehensively and resources can be allocated appropriately. In this way, feasibility of the solution is enhanced.

In one embodiment, the energy storage system further includes a sensor. That the control apparatus obtains an electrical signal at least one electrical connection point in the energy storage system includes: The control apparatus obtains the electrical signal at the at least one electrical connection point from the sensor, where the sensor includes a voltage sensor or a current sensor.

In this embodiment, a specific implementation in which the control apparatus obtains the electrical connection point is specified, and the control apparatus obtains the electrical signal at the electrical connection point by using the sensor. Because the sensor is small and flexible, and is easy to arrange, the sensor can be flexibly arranged at a position of each electrical connection point.

In one embodiment, the control apparatus determines a frequency domain amplitude based on a frequency domain characteristic of the electrical signal includes: The control apparatus determines frequency domain amplitudes corresponding to different frequencies based on the frequency domain characteristic of the electrical signal according to a Fourier transform algorithm.

In this embodiment, a specific implementation of determining the frequency domain amplitude based on the frequency domain characteristic is proposed. The control apparatus may determine the frequency domain amplitude according to the Fourier transform algorithm, so that accuracy of calculating the frequency domain amplitude can be improved, and accuracy of arc fault detection can be improved.

In one embodiment, the control apparatus controls the energy storage system to perform an arc extinguishing and protection operation on the electrical connection point includes: The control apparatus controls the DC-DC converter to generate a reverse electrical signal.

In this embodiment, an arc extinguishing operation is proposed. When the control apparatus determines that an arc fault may occur at the electrical connection point, the control apparatus controls the DC-DC converter to generate the reverse electrical signal to extinguish an arc, thereby ensuring circuit safety.

In one embodiment, the control apparatus controls the energy storage system to perform an arc extinguishing or protection operation on the electrical connection point includes: The control apparatus controls the BMS to cut off an electrical connection path at the electrical connection point; or the control apparatus controls the DC-DC converter to cut off an electrical connection path at the electrical connection point.

In this embodiment, another arc extinguishing or protection operation is further proposed. To be specific, the control apparatus cuts off an electrical connection path at an electrical connection point at which an arc fault may occur. Specifically, the control apparatus may control the BMS to cut off the electrical connection path at the electrical connection point, or control the DC-DC converter to cut off the electrical connection path at the electrical connection point. Therefore, the control apparatus may determine, based on a specific position of the arc fault, the electrical connection path that is to be cut off. In this case, when an arc safety hazard is eliminated, it can be ensured as much as possible that the energy storage system supplies power to the load circuit, thereby enhancing reliability of the solution.

In one embodiment, the electrical signal includes a voltage signal or a current signal.

In this embodiment, a manner in which the electrical signal may be presented is specified. The electrical signal may be a voltage signal or a current signal. This is not specifically limited herein. In this embodiment, an appropriate sensor may be arranged based on a specific circuit status to obtain a current signal or a voltage signal, thereby facilitating subsequent analysis and calculation. Therefore, accuracy of arc fault detection can also be improved.

According to a second aspect, this application provides a control apparatus, including: at least one processor, where the processor is configured to execute a stored program, to specifically implement the following operations: The processor obtains an electrical signal at an electrical connection point in an energy storage system. The processor determines a frequency domain amplitude based on a frequency domain characteristic of the electrical signal. When the frequency domain amplitude is greater than a preset amplitude, the processor controls the energy storage system to perform an arc extinguishing and protection operation on the electrical connection point.

In embodiments of this application, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

In one embodiment, the processor is configured to obtain the electrical signal at the electrical connection point from a sensor, where the sensor includes a voltage sensor or a current sensor.

In this embodiment, a specific implementation in which the control apparatus obtains the electrical connection point is specified, and the control apparatus obtains the electrical signal at the electrical connection point by using the sensor. Because the sensor is small and flexible, and is easy to arrange, the sensor can be flexibly arranged at a position of each electrical connection point.

In one embodiment, the processor is configured to determine frequency domain amplitudes corresponding to different frequencies based on the frequency domain characteristic of the electrical signal according to a Fourier transform algorithm.

In this embodiment, a specific implementation of determining the frequency domain amplitude based on the frequency domain characteristic is proposed. The management apparatus may determine the frequency domain amplitude according to the Fourier transform algorithm, so that accuracy of calculating the frequency domain amplitude can be improved, and accuracy of arc fault detection can be improved.

In one embodiment, the processor is configured to control the DC-DC converter to generate a reverse electrical signal.

In this embodiment, an arc extinguishing operation is proposed. When the control apparatus determines that an arc fault may occur at the electrical connection point, the control apparatus controls the DC-DC converter to generate the reverse electrical signal to extinguish an arc, thereby ensuring circuit safety.

In one embodiment, the processor is configured to control the BMS to cut off an electrical connection path at the electrical connection point; or the processor is specifically configured to control the DC-DC converter to cut off an electrical connection path at the electrical connection point.

In this embodiment, another arc extinguishing or protection operation is further proposed. To be specific, the control apparatus cuts off an electrical path at an electrical connection point at which an arc fault may occur. Specifically, the control apparatus may control the BMS to cut off the electrical connection path at the electrical connection point, or control the DC-DC converter to cut off the electrical connection path at the electrical connection point. Therefore, the control apparatus may determine, based on a specific position of the arc fault, the electrical connection path that is to be cut off. In this case, when an arc safety hazard is eliminated, it can be ensured as much as possible that the energy storage system supplies power to a load circuit, thereby enhancing reliability of the solution.

According to a third aspect, this application provides a control apparatus, including: an obtaining module, configured to obtain an electrical signal at an electrical connection point in an energy storage system; a determining module, configured to determine a frequency domain amplitude based on a frequency domain characteristic of the electrical signal; and an arc extinguishing module, configured to: when the frequency domain amplitude is greater than a preset amplitude, control the energy storage system to perform an arc extinguishing and protection operation on the electrical connection point.

In embodiments of this application, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

In one embodiment, the obtaining module includes an obtaining submodule, configured to obtain the electrical signal at the electrical connection point from a sensor, where the sensor includes a voltage sensor or a current sensor.

In this embodiment, a specific implementation in which the control apparatus obtains the electrical connection point is specified, and the control apparatus obtains the electrical signal at the electrical connection point by using the sensor. Because the sensor is small and flexible, and is easy to arrange, the sensor can be flexibly arranged at a position of each electrical connection point.

In one embodiment, the determining module includes a determining submodule, configured to determine frequency domain amplitudes corresponding to different frequencies based on the frequency domain characteristic of the electrical signal according to a Fourier transform algorithm.

In this embodiment, a specific implementation of determining the frequency domain amplitude based on the frequency domain characteristic is proposed. The management apparatus may determine the frequency domain amplitude according to the Fourier transform algorithm, so that accuracy of calculating the frequency domain amplitude can be improved, and accuracy of arc fault detection can be improved.

In one embodiment, the arc extinguishing module includes a first control submodule, configured to control the DC-DC converter to generate a reverse electrical signal.

In this embodiment, an arc extinguishing operation is proposed. When the control apparatus determines that an arc fault may occur at the electrical connection point, the control apparatus controls the DC-DC converter to generate the reverse electrical signal to extinguish an arc, thereby ensuring circuit safety.

In one embodiment, the arc extinguishing module further includes a second control submodule, configured to control the BMS to cut off an electrical connection path at the electrical connection point, or configured to control the DC-DC converter to cut off an electrical connection path at the electrical connection point.

In this embodiment, another arc extinguishing or protection operation is further proposed. To be specific, the control apparatus cuts off an electrical path at an electrical connection point at which an arc fault may occur. Specifically, the control apparatus may control the BMS to cut off the electrical connection path at the electrical connection point, or control the DC-DC converter to cut off the electrical connection path at the electrical connection point. Therefore, the control apparatus may determine, based on a specific position of the arc fault, the electrical connection path that is to be cut off. In this case, when an arc safety hazard is eliminated, it can be ensured as much as possible that the energy storage system supplies power to a load circuit, thereby enhancing reliability of the solution.

According to a fourth aspect, this application provides an energy management system, including an energy storage system and a control apparatus. The energy storage system includes a battery module, a battery management system BMS, a direct current-direct current DC-DC converter, and a sensor. The battery module is configured to provide electric energy. The BMS is configured to detect a status of the battery module. The DC-DC converter is configured to perform conversion between a high-voltage direct current signal and a low-voltage direct current signal. The sensor is configured to detect an electrical signal at an electrical connection point. The control apparatus performs the method described in the first aspect.

According to a fifth aspect, this application provides a computer-readable storage medium, including instructions. When the instructions are run on a computer, the computer is enabled to perform the method described in the first aspect.

According to a sixth aspect, this application provides a computer program product including instructions. When the computer program product is run on a computer, the computer is enabled to perform the method described in the first aspect.

It can be learned from the foregoing technical solutions that the embodiments of this application have the following advantages:

In the embodiments of this application, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

BRIEF DESCRIPTION OF DRAWINGS

To describe technical solutions in embodiments of this application more clearly, the following briefly describes accompanying drawings used in describing the embodiments. It is clear that the accompanying drawings in the following description show merely some embodiments of this application.

DESCRIPTION OF EMBODIMENTS

Figure 1:
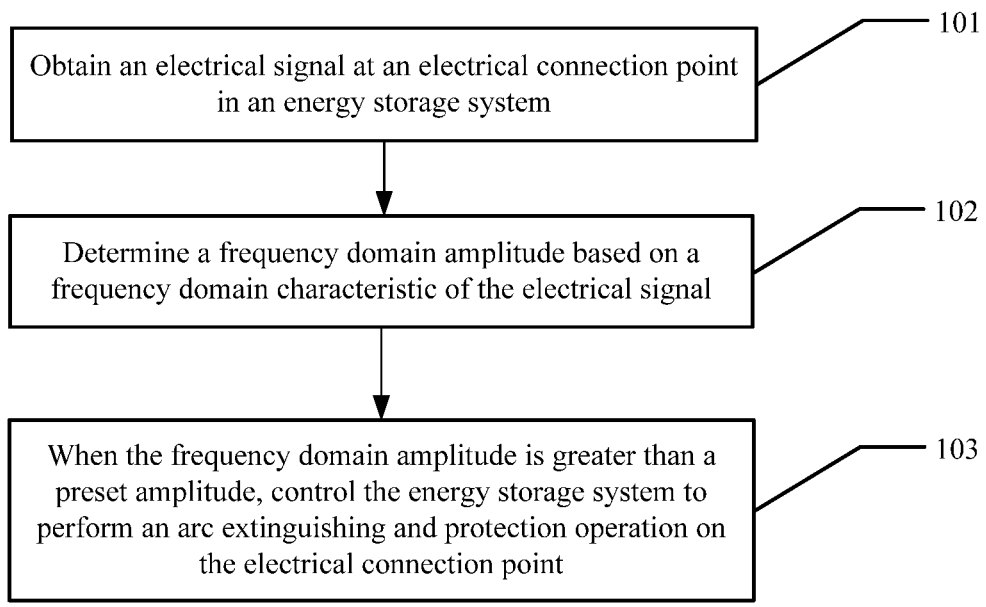
FIG. 1 is a flowchart of an arc detection method for performing protection in an energy storage system according to an embodiment of this application.

The embodiments of this application provide an arc detection method for performing protection in an energy storage system, and a related apparatus, to improve accuracy of arc detection, promptly take an arc extinguishing measure, and reduce a probability of causing a safety hazard.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments of this application described herein can be implemented in other orders than the order illustrated or described herein. Moreover, the terms "include", "contain" and any other variants mean to cover the non-exclusive inclusion, for example, a process, method, system, product, or device that includes a list of operations or units is not necessarily limited to those units, but may include other units not expressly listed or inherent to such a process, method, system, product, or device.

The following describes some terms used in the embodiments of this application.

An arc fault (AF) is an electrical fault that an unintended arc occurs in an energized line. According to a connection relationship between an arc and a circuit when an arc fault occurs, arc faults may be classified into a series arc fault (SAF), a parallel arc fault (PAF), and a grounding arc fault (GAF), and a complex arc fault (CAF). In the method proposed in the embodiments of this application, any one or more of the foregoing arc faults can be detected. This is not specifically limited herein.

A DC-DC converter is a voltage converter that converts an input voltage into a fixed voltage as an effective output. Specifically, DC-DC converters may be classified into three types: a boost DC-DC converter, a buck DC-DC converter, and a buck-boost DC-DC converter. A DC-DC converter used in the embodiments of this application may be any one or more of the foregoing DC-DC converters. This is not specifically limited herein.

A battery management system (BMS) is configured to manage and maintain each battery unit in a battery module, to prevent the battery unit from being over-charged or over-discharged, and prolong a service life of a battery.

The following describes an application scenario to which a method proposed in an embodiment of this application is applicable.

A solution proposed in this embodiment of this application is mainly applied to a scenario in which whether an arc fault occurs in an energy storage system is detected. In this embodiment, the energy storage system usually includes a DC-DC converter, a battery management system BMS, and a battery module, and a plurality of electrical connection points may be formed by connecting the components to each other by using lines. The arc detection method for performing protection in an energy storage system in this embodiment may be used to detect whether an arc fault occurs at each electrical connection point and take a corresponding protection measure.

In addition to the foregoing application scenario, the arc detection method for performing protection in an energy storage system in this embodiment may be further applicable to another scenario in which an arc fault may occur. This is not specifically limited herein.

In this embodiment of this application, a control apparatus for performing the arc detection method for performing protection in an energy storage system may be an independent computer device, or may be a chip configured to implement the control function. This is not specifically limited herein. When the control apparatus is used as an independent computer device, the control apparatus may be manufactured, sold, or used as an independent product. When the control apparatus is a chip or a chipset, the chip or the chipset may be integrated into the energy storage system, for example, the battery management system BMS or the direct current-direct current DC-DC converter in the energy storage system. This is not specifically limited herein. In this embodiment and subsequent embodiments, only the control apparatus is used as an example for description.

To facilitate better understanding of the solution proposed in this embodiment of this application, the following describes a specific procedure in this embodiment. FIG. 1 shows operations that are performed by the control apparatus and that are in the arc detection method for performing protection in an energy storage system. The specific procedure includes the following operations.

101. The control apparatus obtains an electrical signal at an electrical connection point in an energy storage system.

In this embodiment, when the control apparatus needs to learn a status of each section of circuit of the energy storage system, the control apparatus may obtain an electrical signal at each electrical connection point in the energy storage system. The electrical signal includes a voltage signal or a current signal. In this embodiment, the electrical connection point refers to a part that is between components in the energy storage system and that is connected by using a power cable.

Figure 2A:
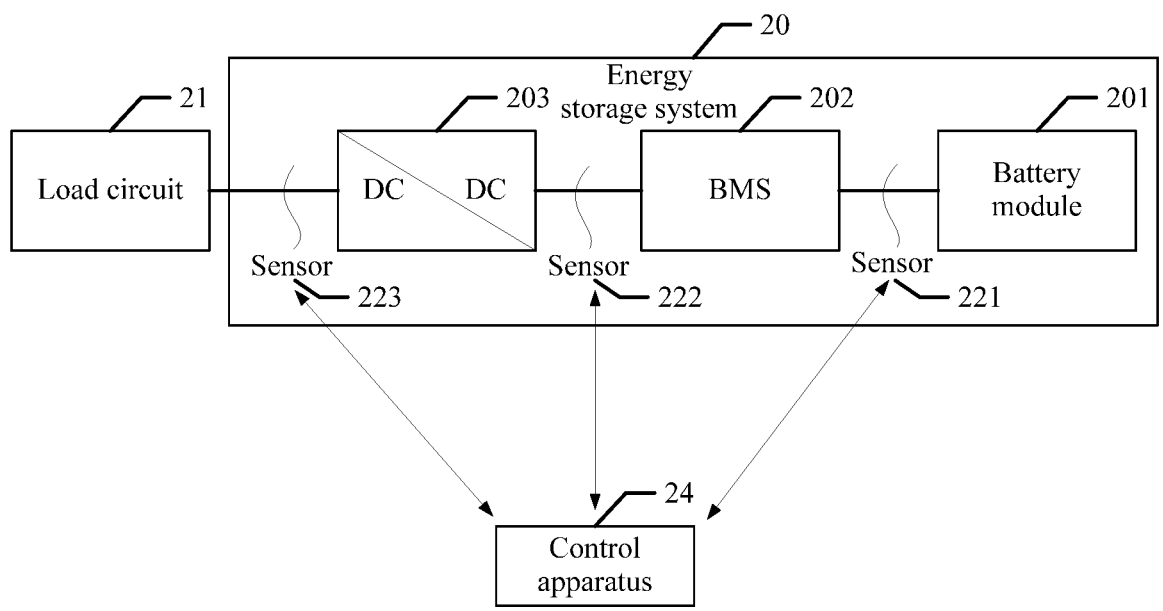
FIG. 2A is a schematic diagram of an embodiment of an arc detection method for performing protection in an energy storage system according to an embodiment of this application.

As shown in FIG. 2A, an energy storage system 20 includes a battery module 201, a battery management system BMS 202, and a direct current-direct current DC-DC converter 203. The battery module 201 may be connected to the battery management system BMS 202, so that the battery module 201 provides electric energy. The battery management system BMS 202 monitors the battery module 201, and measures related data of the battery module 201. The related data may be related data such as a current signal in the battery module 201, a voltage signal in the battery module 201, and operating temperature of the battery module 201. This is not specifically limited herein. In addition, the battery management system BMS 202 is connected to the DC-DC converter 203, so that the DC-DC converter 203 performs conversion on the electric energy provided by the battery module 201, to adapt to a different voltage requirement of a load circuit 21. It can be learned from FIG. 2A that, in the energy storage system 20, there are a plurality of parts that need to be connected by using power cables. Therefore, these parts that need to be connected by using power cables may be referred to as electrical connection points. Specifically, the electrical connection point includes a connection point between the battery module 201 and the battery management system BMS 202, a connection point between the battery management system BMS 202 and the DC-DC converter 203, or a connection point between the DC-DC converter 203 and the load circuit 21.

In this embodiment, a sensor may be arranged at the electrical connection point. As shown in FIG. 2A, the sensor is used to detect an electrical signal at the electrical connection point. For example, a sensor 221 is arranged at the connection point between the battery module 201 and the battery management system BMS 202, a sensor 222 is arranged at the connection point between the battery management system BMS 202 and the DC-DC converter 203, and a sensor 223 is arranged at the connection point between the DC-DC converter 203 and the load circuit 21. Therefore, when a control apparatus 24 obtains the electrical signal at the electrical connection point in the energy storage system 20, the control apparatus 24 may obtain the electrical signal at the electrical connection point from the sensor 221/222/223. The sensor includes a voltage sensor or a current sensor. In this way, the control apparatus may obtain voltage signals or current signals at a plurality of electrical connection points, and then the control apparatus processes and analyzes the voltage signals or the current signals at the plurality of electrical connection points. For details, refer to operation 102.

Figure 2B:
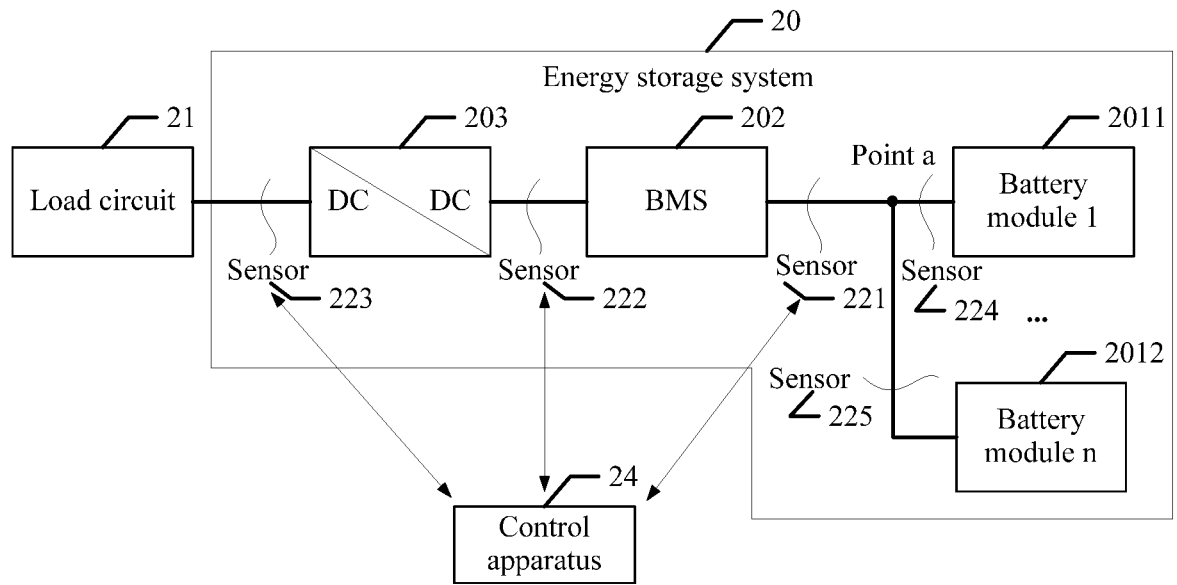
FIG. 2B is a schematic diagram of another embodiment of an arc detection method for performing protection in an energy storage system according to an embodiment of this application.

In this embodiment, the BMS may manage a plurality of battery modules. As shown in FIG. 2B, a plurality of battery modules 2011/2012 may be connected in parallel to the BMS 202. In this case, a plurality of sensors may be disposed to separately monitor different lines. For example, a sensor 224 is arranged between the battery module 1 2011 and a point a, a sensor 225 is arranged between the battery module n 2012 and the point a, and a sensor 221 is arranged between the point a and the BMS.

Figure 2C:
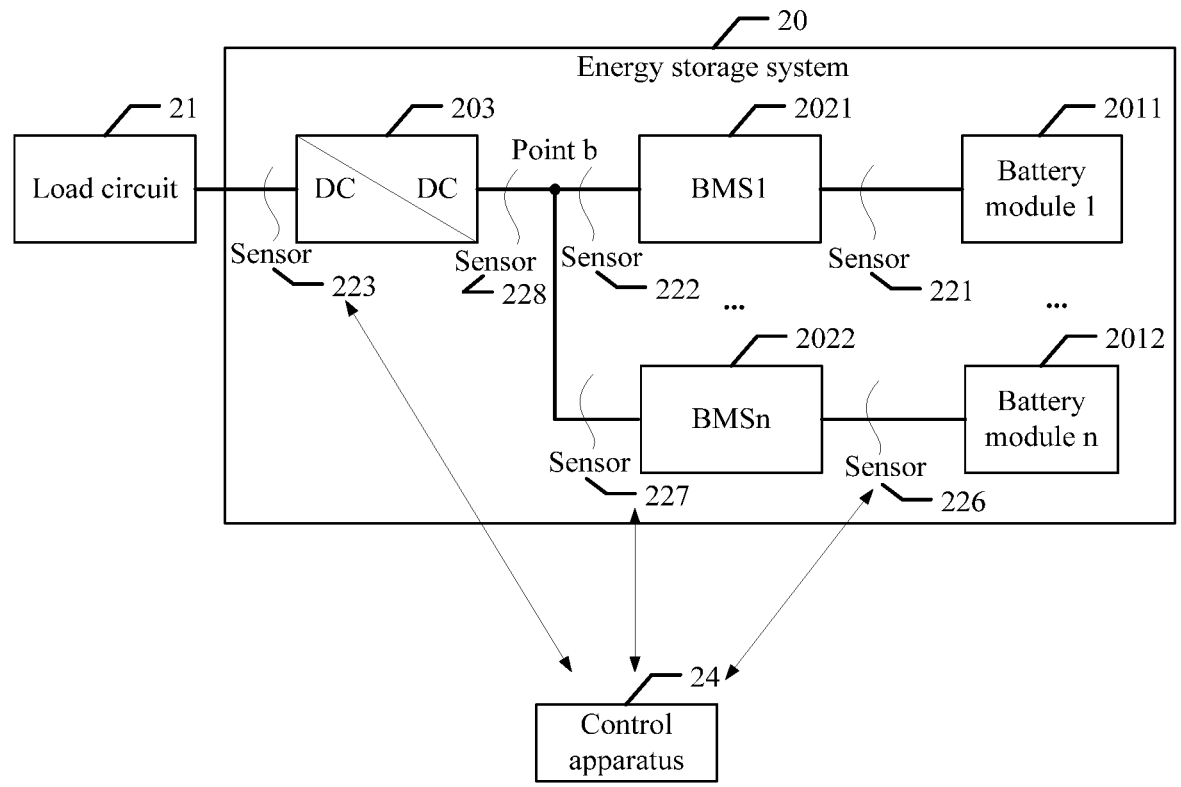
FIG. 2C is a schematic diagram of another embodiment of an arc detection method for performing protection in an energy storage system according to an embodiment of this application.

It should be understood that FIG. 2A is merely an internal structural diagram of a relatively simple energy storage system. In actual application, a plurality of layout manners may be used inside the energy storage system. As shown in FIG. 2C, the energy storage system may use a manner in which BMSs are connected in parallel. A BMSn 2022 and the battery module n 2012 may be connected in series, and then connected in parallel, at a point b between the DC-DC converter 203 and a BMS1 2021, to the BMS1 2021 and the battery module 1 2011 that are connected in series. In this case, a sensor 222 needs to be arranged between the BMS1 2021 and the point b, a sensor 227 needs to be arranged between the BMSn 2022 and the point b, and a sensor 228 needs to be arranged between the DC-DC converter and the point b. Certainly, a sensor 226 also needs to be arranged between the BMSn 2022 and the battery module n 2012. Therefore, the control apparatus may obtain electrical signals on all branches by using the sensors, to analyze the electrical signals subsequently. In actual application, a plurality of devices and components may further be connected in parallel, at the point b between the DC-DC converter 203 and the BMS1 2021, to the BMS1 2021 and the battery module 1 2011 that are connected in series. This is not specifically limited herein.

Figure 2D:
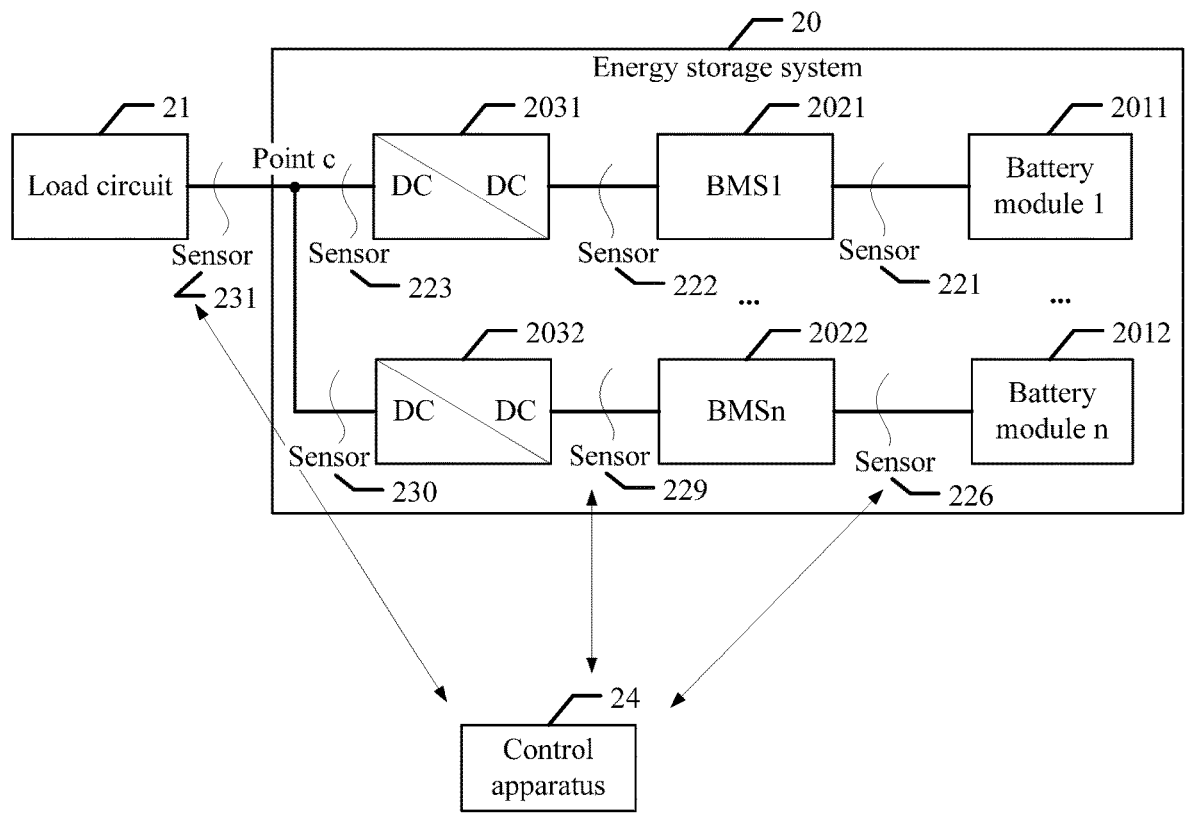
FIG. 2D is a schematic diagram of another embodiment of an arc detection method for performing protection in an energy storage system according to an embodiment of this application.

In addition, FIG. 2D is another internal structural diagram of the energy storage system. In this case, a DC-DC converter 2032, the BMSn 2022, and the battery module n 2012 may be connected in series, and then connected in parallel, at a point c between a DC-DC converter 2031 and the load circuit 21, to the DC-DC converter 2031, the BMS1 2021, and the battery module 1 2011 that are connected in series. Similarly, in this case, a sensor 231 needs to be arranged between the load circuit 21 and the point c, a sensor 223 needs to be arranged between the DC-DC converter 2031 and the point c, and a sensor 230 needs to be arranged between the DC-DC converter and the point c. In addition, a sensor 226 should also be arranged between the BMSn 2022 and the battery module n 2012, and a sensor 229 should also be arranged between the DC-DC converter 2032 and the BMSn 2022. Then, the control apparatus may obtain electrical signals on all branches by using the sensors, to analyze the electrical signals subsequently. In actual application, a plurality of devices and components may further be connected in parallel, at the point c between the DC-DC converter 2031 and the load circuit 21, to the DC-DC converter 2031, the BMS1 2021, and the battery module 1 2011 that are connected in series. This is not specifically limited herein.

It should be noted that the foregoing plurality of sensor arrangement manners are only some common feasible manners. In actual application, more or fewer sensors may be arranged based on a specific line layout, to appropriately allocate resources.

In addition, it should also be noted that, when the battery management system BMS can detect a current signal or a voltage signal of a power cable between the battery module and the battery management system BMS, the control apparatus can also obtain some electrical signals from the battery management system BMS.

102. The control apparatus determines a frequency domain amplitude based on a frequency domain characteristic of the electrical signal.

In this embodiment, after obtaining the electrical signal, the control apparatus may extract the frequency domain characteristic of the electrical signal. A frequency domain characteristic of an electrical signal existing during normal operating is relatively greatly different from a frequency domain characteristic of an electrical signal existing when an arc is generated. Therefore, the control apparatus may analyze the frequency domain characteristic of the electrical signal to determine whether an arc is generated.

Figure 2E:
FIG. 2E is a schematic diagram of another embodiment of an arc detection method for performing protection in an energy storage system according to an embodiment of this application.
Figure 2F:
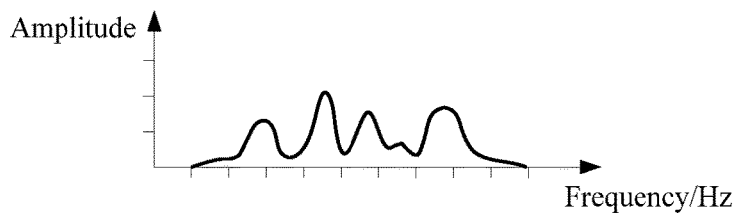
FIG. 2F is a schematic diagram of another embodiment of an arc detection method for performing protection in an energy storage system according to an embodiment of this application.

Specifically, after the control apparatus obtains the electrical signal, the control apparatus may analyze the frequency domain characteristic of the electrical signal according to a Fourier transform algorithm, to calculate a frequency domain amplitude that is of the electrical signal and that corresponds to each frequency. Specifically, the control apparatus may perform normalization processing on the electrical signal to obtain a scalar of a relative relationship, and then perform Fourier transform processing to obtain a spectrum graph corresponding to the electrical signal. FIG. 2E is a spectrum graph existing when no arc fault occurs. In this case, the frequency domain amplitudes corresponding to all the frequencies are relatively low and relatively balanced. FIG. 2F is a spectrum graph existing when an arc fault occurs at the electrical connection point. It can be learned through comparative analysis between FIG. 2E and FIG. 2F that, when an arc fault occurs at the electrical connection point, frequency domain amplitudes corresponding to some frequencies increase, and changes of amplitudes corresponding to different frequencies may be different. When the arc fault at the electrical connection point is relatively serious, a change difference between the frequency domain amplitudes corresponding to the different frequencies gradually increases. Therefore, the control apparatus may compare the frequency domain amplitude with a preset amplitude. Specifically, the control apparatus may compare a frequency domain amplitude corresponding to a frequency with a preset amplitude corresponding to the frequency, and when the frequency domain amplitude is greater than the preset amplitude, determine that an arc fault occurs at the electrical connection point. Different preset amplitudes corresponding to different frequencies may be adjusted by operation and maintenance personnel based on an actual case, to improve accuracy of arc detection. This is not specifically limited herein.

After determining that an arc fault occurs at the electrical connection point, the control apparatus performs operation 103.

It should be noted that, in this embodiment, to avoid impact caused due to interference, a signal in a frequency band as high as possible in a frequency spectrum corresponding to a frequency domain characteristic may be selected for arc fault analysis. However, to ensure a signal-to-noise ratio of the detected signal and reduce calculation and analysis requirements on the control apparatus, a selected frequency band should not be excessively high. Specifically, the control apparatus may select a frequency domain characteristic for analysis based on actual application. This is not specifically limited herein.

103. When the frequency domain amplitude is greater than the preset amplitude, the control apparatus controls the energy storage system to perform an arc extinguishing operation on the electrical connection point.

In this embodiment, when the frequency domain amplitude is greater than the preset amplitude, the control apparatus may control the energy storage system to perform the arc extinguishing operation on the electrical connection point. Specifically, the control apparatus may perform the arc extinguishing operation on the electrical connection point in the following manners:

1. The control apparatus controls the DC-DC converter to generate a reverse electrical signal.

In this embodiment, when the control apparatus determines that an arc fault occurs at an electrical connection point, the control apparatus may control a DC-DC converter connected to the electrical connection point to generate a reverse electrical signal, to promptly extinguish an arc. Specifically, the DC-DC converter may control, based on an indication of the control apparatus, an electric potential to change, and further output a reverse electric potential based on a requirement.

2. The control apparatus controls the energy storage system to cut off an electrical connection path at the electrical connection point.

In addition to the foregoing manner of generating the reverse electrical signal to extinguish the arc, in this embodiment, the control apparatus may control the energy storage system to cut off the electrical connection point. Specifically, when an arc is generated between the battery module and the BMS, the control apparatus may control the BMS to break a connection between the BMS and the battery module, thereby cutting off a power supply to terminate the arc fault. In addition, when an arc fault occurs between the DC-DC converter and the BMS, the control apparatus may control the DC-DC converter to break a connection between the DC-DC converter and the BMS, and further break a connection between the battery module and the load circuit, thereby cutting off the power supply to terminate the arc fault.

In this embodiment, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

Figure 3:
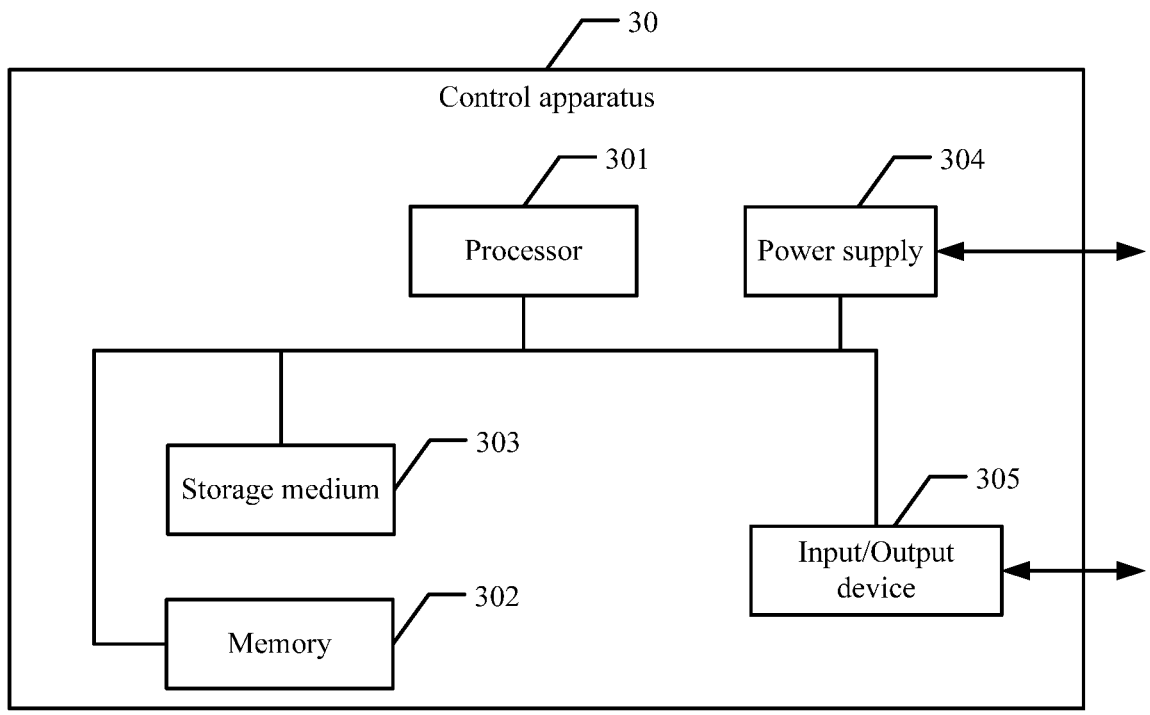
FIG. 3 is a schematic diagram of an embodiment of a control apparatus according to an embodiment of this application.

The foregoing describes the method proposed in the embodiments of this application. The following describes a structure of the control apparatus used in the arc detection method for performing protection in an energy storage system. As shown in FIG. 3, when the control apparatus 30 is an independent computer device or server, the control apparatus 30 may vary greatly with a configuration or performance. The control apparatus 30 may include one or more processors 301, one or more memories 302, and one or more storage media 303 (for example, one or more mass storage devices) for storing application programs or data. The memory 302 and the storage medium 303 may be a transient storage or a persistent storage.

The control apparatus further includes one or more input/output devices 305. The input/output device 305 is configured to receive data transmitted by a sensor or send a control instruction to an energy storage system.

Further, the processor 301 may be configured to communicate with the storage medium 303, and the processor 301 is configured to execute the application programs in the storage medium 303. Specifically, the processor obtains an electrical signal at an electrical connection point in the energy storage system. The processor determines a frequency domain amplitude based on a frequency domain characteristic of the electrical signal. When the frequency domain amplitude is greater than a preset amplitude, the processor controls the energy storage system to perform an arc extinguishing and protection operation on the electrical connection point.

In some embodiments, the processor may obtain the electrical signal at the electrical connection point from a sensor. The sensor includes a voltage sensor or a current sensor. In such an implementation, a specific implementation in which the control apparatus obtains the electrical connection point is specified, and the control apparatus obtains the electrical signal at the electrical connection point by using the sensor. Because the sensor is small and flexible, and is easy to arrange, the sensor can be flexibly arranged at a position of each electrical connection point.

In some other embodiments, the processor may determine frequency domain amplitudes corresponding to different frequencies based on the frequency domain characteristic of the electrical signal according to a Fourier transform algorithm. In such an implementation, a specific implementation of determining the frequency domain amplitude based on the frequency domain characteristic is proposed. The management apparatus may determine the frequency domain amplitude according to the Fourier transform algorithm, so that accuracy of calculating the frequency domain amplitude can be improved, and accuracy of arc fault detection can be improved.

In some embodiments, in which the processor may control the DC-DC converter to generate a reverse electrical signal. In such an implementation, an arc extinguishing operation is proposed. When the control apparatus determines that an arc fault may occur at the electrical connection point, the control apparatus controls the DC-DC converter to generate the reverse electrical signal to extinguish an arc, thereby ensuring circuit safety.

In addition to the foregoing embodiments, some other embodiments in which the processor is configured to control the BMS to cut off an electrical connection path at the electrical connection point, or the processor is specifically configured to control the DC-DC converter to cut off an electrical connection path at the electrical connection point. In such an embodiment, another arc extinguishing or protection operation is proposed. To be specific, the control apparatus cuts off an electrical path at an electrical connection point at which an arc fault may occur. Specifically, the control apparatus may control the BMS to cut off the electrical connection path at the electrical connection point, or control the DC-DC converter to cut off the electrical connection path at the electrical connection point. Therefore, the control apparatus may determine, based on a specific position of the arc fault, the electrical connection path that is to be cut off. In this case, when an arc safety hazard is eliminated, it can be ensured as much as possible that the energy storage system supplies power to a load circuit, thereby enhancing reliability of the solution.

It should be understood that the control apparatus 30 may further include one or more power supplies 304 and/or one or more operating systems, such as Windows Server™, Mac OS X™, Unix™, Linux™, and FreeBSD™.

It should also be understood that, in the method embodiment corresponding to FIG. 1, all operations performed by the control apparatus may be based on the structure of the control apparatus 30 shown in FIG. 3.

In this embodiment of this application, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

Figure 4:
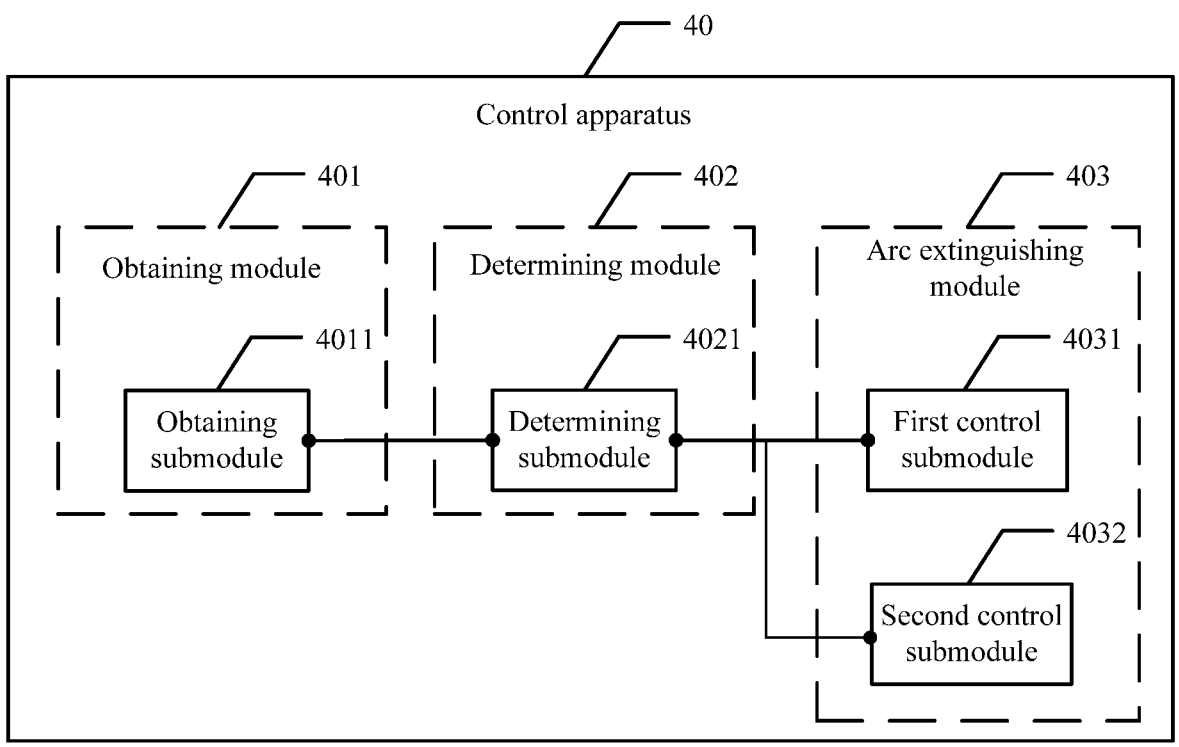
FIG. 4 is a schematic diagram of another embodiment of a control apparatus according to an embodiment of this application.

The foregoing describes the control apparatus that performs the arc detection method for performing protection in an energy storage system. The following describes another implementation of the control apparatus in this embodiment. Specifically, as shown in FIG. 4, the control apparatus 40 includes an obtaining module 401, a determining module 402, and an arc extinguishing module 403. Specifically, the obtaining module 401 is configured to obtain an electrical signal at an electrical connection point in an energy storage system. The determining module 402 is configured to determine a frequency domain amplitude based on a frequency domain characteristic of the electrical signal. The arc extinguishing module 403 is configured to: when the frequency domain amplitude is greater than a preset amplitude, control, by using the processor, the energy storage system to perform an arc extinguishing and protection operation on the electrical connection point.

The obtaining module 401 includes an obtaining submodule 4011, configured to obtain the electrical signal at the electrical connection point from a sensor. The sensor includes a voltage sensor or a current sensor. In such an implementation, a specific implementation in which the control apparatus obtains the electrical connection point is specified, and the control apparatus obtains the electrical signal at the electrical connection point by using the sensor. Because the sensor is small and flexible, and is easy to arrange, the sensor can be flexibly arranged at a position of each electrical connection point.

The determining module 402 includes a determining submodule 4021, configured to determine frequency domain amplitudes corresponding to different frequencies based on the frequency domain characteristic of the electrical signal according to a Fourier transform algorithm. In such an implementation, a specific implementation of determining the frequency domain amplitude based on the frequency domain characteristic is proposed. The management apparatus may determine the frequency domain amplitude according to the Fourier transform algorithm, so that accuracy of calculating the frequency domain amplitude can be improved, and accuracy of arc fault detection can be improved.

In some embodiments, the arc extinguishing module 403 includes a first control submodule 4031, configured to control the DC-DC converter to generate a reverse electrical signal. When the control apparatus determines that an arc fault may occur at the electrical connection point, the control apparatus controls the DC-DC converter to generate the reverse electrical signal to extinguish an arc, thereby ensuring circuit safety.

In addition, the arc extinguishing module 403 further includes a second control submodule 4032, configured to control the BMS to cut off an electrical connection path at the electrical connection point, or configured to control the DC-DC converter to cut off an electrical connection path at the electrical connection point. In this embodiment, another arc extinguishing or protection operation is further proposed. To be specific, the control apparatus cuts off an electrical path at an electrical connection point at which an arc fault may occur. Specifically, the control apparatus may control the BMS to cut off the electrical connection path at the electrical connection point, or control the DC-DC converter to cut off the electrical connection path at the electrical connection point. Therefore, the control apparatus may determine, based on a specific position of the arc fault, the electrical connection path that is to be cut off. In this case, when an arc safety hazard is eliminated, it can be ensured as much as possible that the energy storage system supplies power to a load circuit, thereby enhancing reliability of the solution.

In this embodiment, the control apparatus may determine the frequency domain amplitude based on the frequency domain characteristic of the electrical signal. When the frequency domain amplitude is greater than the preset amplitude, the control apparatus controls the energy storage system to perform the arc extinguishing and protection operation on the electrical connection point. The control apparatus determines, based on the frequency domain amplitude of the electrical signal, whether an arc is likely to be generated. The frequency domain amplitude changes significantly when an arc is to be generated or when an arc is just generated. Therefore, if the frequency domain amplitude exceeds the preset amplitude, it can be determined that an arc is generated at the electrical connection point, and the arc extinguishing and protection operation can be quickly performed. Therefore, compared with a manner of determining, by using a voltage value or a current value, whether an arc is generated, this manner is more accurate and efficient, and can reduce a probability of causing a safety hazard.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. An arc detection method for performing protection in an energy storage system, comprising:
   obtaining, by a control apparatus, an electrical signal at an electrical connection point in an energy storage system, wherein the energy storage system comprises a battery module, a battery management system (BMS), and a direct current-direct current (DC-DC) converter; and
   wherein the electrical connection point comprises a connection point between the battery module and the BMS, a connection point between the BMS and the DC-DC converter, or a connection point between the DC-DC converter and a load circuit;
   determining, by the control apparatus, a frequency domain amplitude of the electrical signal based on a frequency domain characteristic of the electrical signal; and
   controlling, by the control apparatus, the energy storage system to perform an arc extinguishing and protection operation on the electrical connection point in response to that the frequency domain amplitude of the electrical signal is greater than a preset amplitude, wherein the controlling, by the control apparatus, the energy storage system to perform the arc extinguishing and protection operation on the electrical connection point comprises:
   controlling, by the control apparatus, the DC-DC converter to generate a reverse electrical signal, comprising:
   controlling an electric potential to change and outputting a reverse electric potential based on a requirement.

2. The method according to claim 1, wherein the energy storage system further comprises a sensor; and
   wherein the obtaining, by a control apparatus, an electrical signal at an electrical connection point in an energy storage system comprises:
   obtaining, by the control apparatus, the electrical signal at the electrical connection point by the sensor, wherein the sensor comprises a voltage sensor or a current sensor.

3. The method according to claim 1, wherein the determining, by the control apparatus, a frequency domain amplitude of the electrical signal based on a frequency domain characteristic of the electrical signal comprises:
   determining, by the control apparatus, frequency domain amplitudes corresponding to different frequencies of the electrical signal based on the frequency domain characteristic of the electrical signal according to a Fourier transform algorithm.

4. The method according to claim 1, wherein the energy storage system further comprises a sensor, wherein the sensor comprises a voltage sensor or a current sensor, and wherein the electrical signal comprises a voltage signal or a current signal.

5. A control apparatus, comprising:
   a processor, wherein the processor is configured to execute a stored program, to perform operations, the operations comprising:
   obtaining, by the processor, an electrical signal at an electrical connection point in an energy storage system, wherein the energy storage system comprises a battery module, a battery management system (BMS), and a direct current-direct current (DC-DC) converter; and wherein the electrical connection point comprises a connection point between the battery module and the BMS, a connection point between the BMS and the DC-DC converter, or a connection point between the DC-DC converter and a load circuit;
   determining, by the processor, a frequency domain amplitude of the electrical signal based on a frequency domain characteristic of the electrical signal; and
   controlling, by the processor, the energy storage system to perform an arc extinguishing and protection operation on the electrical connection point in response to that the frequency domain amplitude of the electrical signal is greater than a preset amplitude, wherein the controlling, by the control apparatus, the energy storage system to perform the arc extinguishing and protection operation on the electrical connection point comprises:
controlling, by the control apparatus, the DC-DC converter to generate a reverse electrical signal, comprising:
controlling an electric potential to change and outputting a reverse electric potential based on a requirement.

6. The control apparatus according to claim 5, wherein the processor is configured to obtain the electrical signal at the electrical connection point by a sensor, wherein the sensor comprises a voltage sensor or a current sensor.

7. The control apparatus according to claim 5, wherein the processor is configured to determine frequency domain amplitudes of the electrical signal corresponding to different frequencies based on the frequency domain characteristic of the electrical signal according to a Fourier transform algorithm.

8. An energy management system, comprising:
an energy storage system comprising:
a battery module configured to provide electric energy;
a battery management system (BMS) configured to detect a status of the battery module;
a direct current-direct current (DC-DC) converter configured to perform conversion between a high-voltage direct current signal and a low-voltage direct current signal; and
a sensor configured to detect an electrical signal at an electrical connection point; and
a control apparatus configured to perform operations, the operations comprising:
obtaining the electrical signal at the electrical connection point in the energy storage system, wherein the electrical connection point comprises a connection point between the battery module and the BMS, a connection point between the BMS and the DC-DC converter, or a connection point between the DC-DC converter and a load circuit;
determining a frequency domain amplitude of the electrical signal based on a frequency domain characteristic of the electrical signal; and
controlling the energy storage system to perform an arc extinguishing and protection operation on the electrical connection point in response to that the frequency domain amplitude of the electrical signal is greater than a preset amplitude, wherein the controlling the energy storage system to perform the arc extinguishing and protection operation on the electrical connection point comprises:
controlling the DC-DC converter to generate a reverse electrical signal, comprising:
controlling an electric potential to change and outputting a reverse electric potential based on a requirement.

9. The system according to claim 8, wherein the energy storage system further comprises a sensor; and
wherein the obtaining the electrical signal at the electrical connection point in the energy storage system comprises:
obtaining the electrical signal at the electrical connection point by the sensor, wherein the sensor comprises a voltage sensor or a current sensor.

10. The system according to claim 8, wherein the determining a frequency domain amplitude of the electrical signal based on a frequency domain characteristic of the electrical signal comprises:
determining frequency domain amplitudes corresponding to different frequencies of the electrical signal based on the frequency domain characteristic of the electrical signal according to a Fourier transform algorithm.

11. The system according to claim 8, wherein the electrical signal comprises a voltage signal or a current signal.

* * * * *